United States Patent
Yamazaki et al.

(10) Patent No.: US 7,462,572 B2
(45) Date of Patent: Dec. 9, 2008

(54) PLASMA TREATMENT APPARATUS AND METHOD FOR PLASMA TREATMENT

(75) Inventors: Shunpei Yamazaki, Tokyo (JP); Yasuyuki Arai, Kanagawa (JP); Yasuko Watanabe, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 11/950,818

(22) Filed: Dec. 5, 2007

(65) Prior Publication Data

US 2008/0085377 A1    Apr. 10, 2008

Related U.S. Application Data

(60) Continuation of application No. 11/410,234, filed on Apr. 25, 2006, now Pat. No. 7,307,029, which is a division of application No. 10/731,484, filed on Dec. 10, 2003, now Pat. No. 7,064,089.

(30) Foreign Application Priority Data

Dec. 10, 2002  (JP) .............................. 2002-358782

(51) Int. Cl.
*H01L 21/26*  (2006.01)
(52) U.S. Cl. ................... 438/795; 257/E21.475
(58) Field of Classification Search ................... 438/795
See application file for complete search history.

(56) References Cited

U.S. PATENT DOCUMENTS

| | | |
|---|---|---|
| 5,198,724 A | 3/1993 | Koinuma et al. |
| 5,221,427 A | 6/1993 | Koinuma et al. |
| 5,369,336 A | 11/1994 | Koinuma et al. |
| 5,549,780 A | 8/1996 | Koinuma et al. |
| 5,569,502 A | 10/1996 | Koinuma et al. |
| 5,648,000 A | 7/1997 | Yamazaki et al. |
| 5,932,302 A | 8/1999 | Yamazaki et al. |

(Continued)

FOREIGN PATENT DOCUMENTS

JP          10-199697       7/1998

(Continued)

*Primary Examiner*—W. David Coleman
(74) *Attorney, Agent, or Firm*—Nixon Peabody LLP; Jeffrey L. Costellia

(57) ABSTRACT

A plasma treatment apparatus and a method for plasma treatment are provided that made possible to control accurately a distance between plasma and an object to be treated (hereinafter referred to as an object), and that facilitated a transportation of a substrate that a width is thin and grown in size. The plasma treatment apparatus of the present invention is provided with a gas supply means for introducing a processing gas into a place between a first electrode and a second electrode under an atmospheric pressure or around atmospheric pressure; a plasma generation means for generating plasma by applying a high frequency voltage to the first electrode or the second electrode under the condition that the processing gas is introduced; and, a transport means for transporting the object by floating the object by blowing the processing gas or a transporting gas to the object. An etching treatment; an ashing treatment; a thin film formation; or a cleaning treatment of components using the first electrode and the second electrode is carried out by moving a relative position between the first electrode and the second electrode, and the object.

18 Claims, 6 Drawing Sheets

U.S. PATENT DOCUMENTS

| | | |
|---|---|---|
| 6,001,431 A | 12/1999 | Itoh et al. |
| 6,001,432 A | 12/1999 | Yamazaki et al. |
| 6,171,674 B1 | 1/2001 | Yamazaki et al. |
| 6,183,565 B1 | 2/2001 | Granneman et al. |
| 6,183,816 B1 | 2/2001 | Yamazaki et al. |
| 6,329,304 B1 | 12/2001 | Kuznetsov et al. |
| 6,429,400 B1 | 8/2002 | Sawada et al. |
| 6,468,617 B1 | 10/2002 | Yamazaki et al. |
| 6,660,609 B2 | 12/2003 | Tanaka et al. |
| 6,706,568 B2 | 3/2004 | Nakajima |
| 6,746,237 B2 | 6/2004 | Storm et al. |
| 6,835,523 B1 | 12/2004 | Yamazaki et al. |
| 6,847,006 B2 | 1/2005 | Yamazaki et al. |
| 6,855,584 B2 | 2/2005 | Yamazaki et al. |
| 6,861,338 B2 | 3/2005 | Maekawa |
| 6,917,079 B2 | 7/2005 | Maekawa |
| 2004/0050685 A1 | 3/2004 | Yara et al. |
| 2004/0075396 A1 | 4/2004 | Okumura et al. |
| 2004/0106242 A1 | 6/2004 | Arao et al. |
| 2004/0142581 A1 | 7/2004 | Nakajima |
| 2005/0112850 A1 | 5/2005 | Yamazaki et al. |

FOREIGN PATENT DOCUMENTS

| | | |
|---|---|---|
| JP | 2001-093871 | 4/2001 |

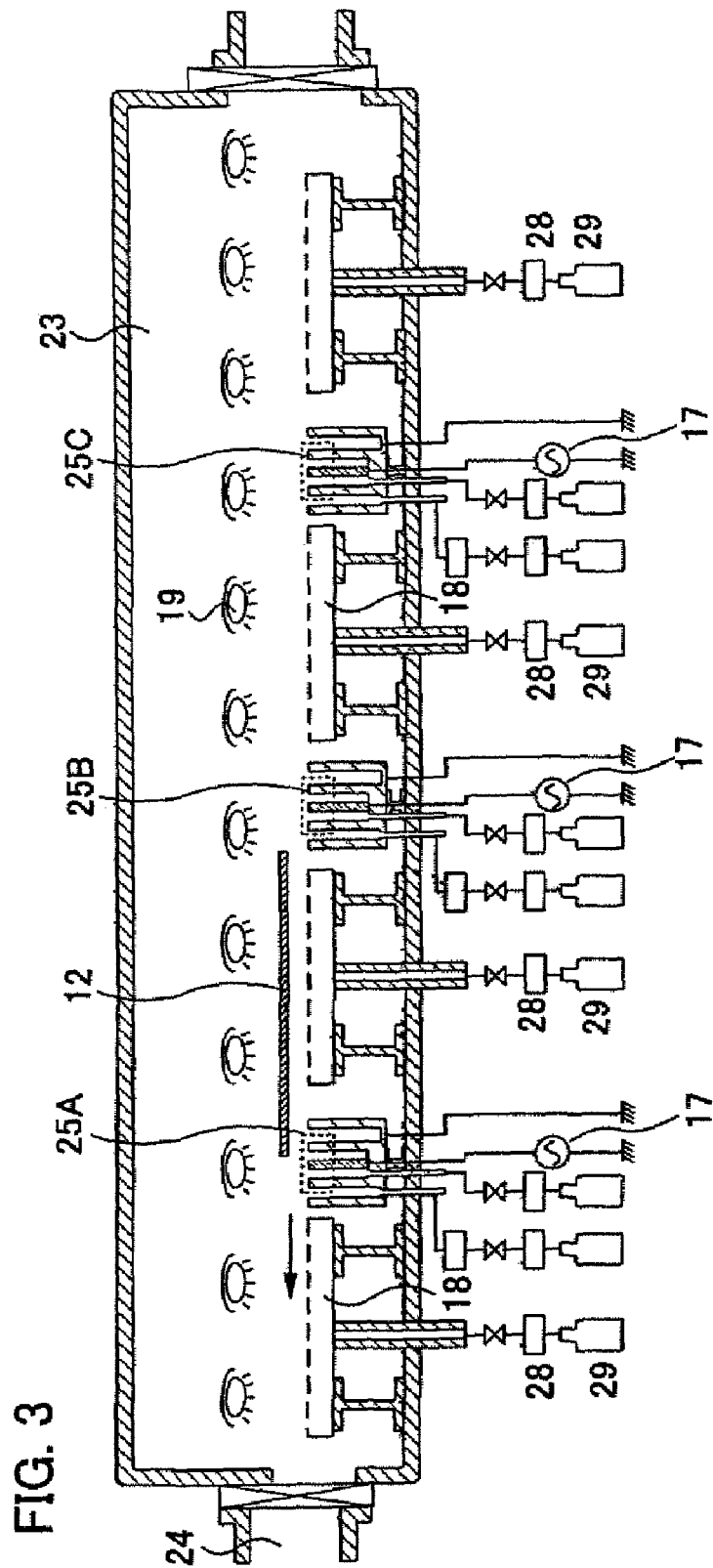

PLASMA TREATMENT APPARATUS AND METHOD FOR PLASMA TREATMENT

BACKGROUND OF THE INVENTION

1. Field of the Invention

The present invention relates to a plasma treatment apparatus and a method for plasma treatment that carry out efficiently a plasma treatment, such as forming a thin film, etching, ashing, and the like.

2. Description of the Related Art

The technique of forming a pixel or a driving circuit by using a semiconductor device formed over an insulating material by a polycrystalline semiconductor has been actively developed in order to contribute to miniaturization and low electric power consumption. The plasma apparatus is used for forming a semiconductor device in the most of the case; however, in the plasma apparatus, there is one that almost operates under an atmospheric pressure and that a load-lock is unnecessary by isolating a process area and the like with a gas flow (for instance, Patent Document 1 is referred).

[Patent Document 1] Japanese Patent Laid-Open No. 2001-93871

It has been difficult to control accurately a distance between plasma to be generated and an object to be treated. Furthermore, in accordance with a weight saving and an efficiency of manufacturing process, a thickness of a substrate, which is a main object to be treated, is reduced to from 1 mm to 10 mm, and a width and a length have grown in size of more than 1 m; therefore, it has been difficult to transport a substrate, and a warp has been made in the substrate and has been broken during the transportation.

SUMMARY OF TE INVENTION

Accordingly, it is an object of the present invention to provide a plasma treatment apparatus and a method for plasma treatment that makes possible to control accurately a distance between plasma and an object to be treated, and that facilitate a transportation of an object such as a substrate that becomes thin in width and grown in size.

In order to solve the above problem, the following means is taken in the present invention.

A plasma treatment apparatus of the present invention comprising: a gas supply means for introducing a processing gas into a space between a first electrode and a second electrode (between a pair of electrodes) under an atmospheric pressure or around atmospheric pressure; a plasma generation means for generating plasma by applying a high frequency voltage to the first electrode or the second electrode under the condition that the processing gas is introduced; and a transport means that the object to be treated is transported by floating the object to be treated by blowing the processing gas or a transporting gas to the object to be treated. In addition, an etching treatment; an ashing treatment; and a thin film formation by plasma CVD are carried out to the object to be treated or the surface of the object to be treated by moving the plasma generated in the space between the first electrode and the second electrode, that is, a relative position between the first electrode and the second electrode, and the object to be treated. Or, a cleaning treatment of a component is carried out by using the plasma generated in the space between the first electrode and the second electrode, that is, the cleaning is carried out by using the first electrode and the second electrode. Furthermore, the first electrode is formed so as to surround the periphery of the second electrode, and formed in a cylindrical shape having the gas supply port of a nozzle shape at its edge in the plasma supply means.

Note that, a thin film formation by plasma CVD utilizes chemical reaction using a gas over the surface of the object to be treated.

In the above plasma treatment apparatus, any one of a film formation by plasma CVD; an etching treatment; an ashing treatment; or a cleaning treatment of the component can be carried out by changing appropriately the gas to be used.

In the present invention, a processing gas is introduced a space between a first and a second electrodes between a pair of electrodes) under an atmospheric pressure or around atmospheric pressure; plasma is generated by applying a high frequency voltage to the first electrode or the second electrode under the condition that the processing gas is introduced; and an object to be treated is transported by floating the object to be treated by blowing the processing gas or a transporting gas to the object to be treated. In addition, an etching treatment; an ashing treatment; a thin film formation by plasma CVD; or a cleaning treatment of a component using the plasma is carried out by transferring a relative position of the plasma and the object to be treated.

In the present invention, an object to be treated is heated uniformly by blowing the heated gas, and the plasma treatment apparatus and a method for plasma treatment are provided that carry out a plasma treatment efficiently by floating the object to be treated horizontally and under the condition of noncontact while moving. Moreover, the entire surface of the object to be treated is moved by the airflow control means that sprays the gas in an oblique direction and a vertical direction. In addition, the object to be treated is blown and sucked simultaneously by the airflow control means to control the height that the object to be treated is floated, level accuracy of the object to be treated is adjusted by the gas flow, and the height of the object to be treated is adjusted accurately. In the present invention having the above structure, the distance between the plasma and the object to be treated may be controlled easily.

BRIEF DESCRIPTION OF THE DRAWINGS

In the accompanying drawings:

FIG. 3 is a schematic diagram showing a plasma treatment apparatus of the present invention;

DETAILED DESCRIPTION OF THE PREFERRED EMBODIMENTS

As for the present embodiment mode, it will be described in detail using the drawings. However, the present invention is not limited to the description below, and it may be understood by the skilled person without trouble that the embodiment. and the detail may be changed variously as long as not deviating from the purpose and the extent of the present invention. Therefore, the present invention is not interpreted limiting to the description of the embodiment mode described below.

Figures 1A, 1B:
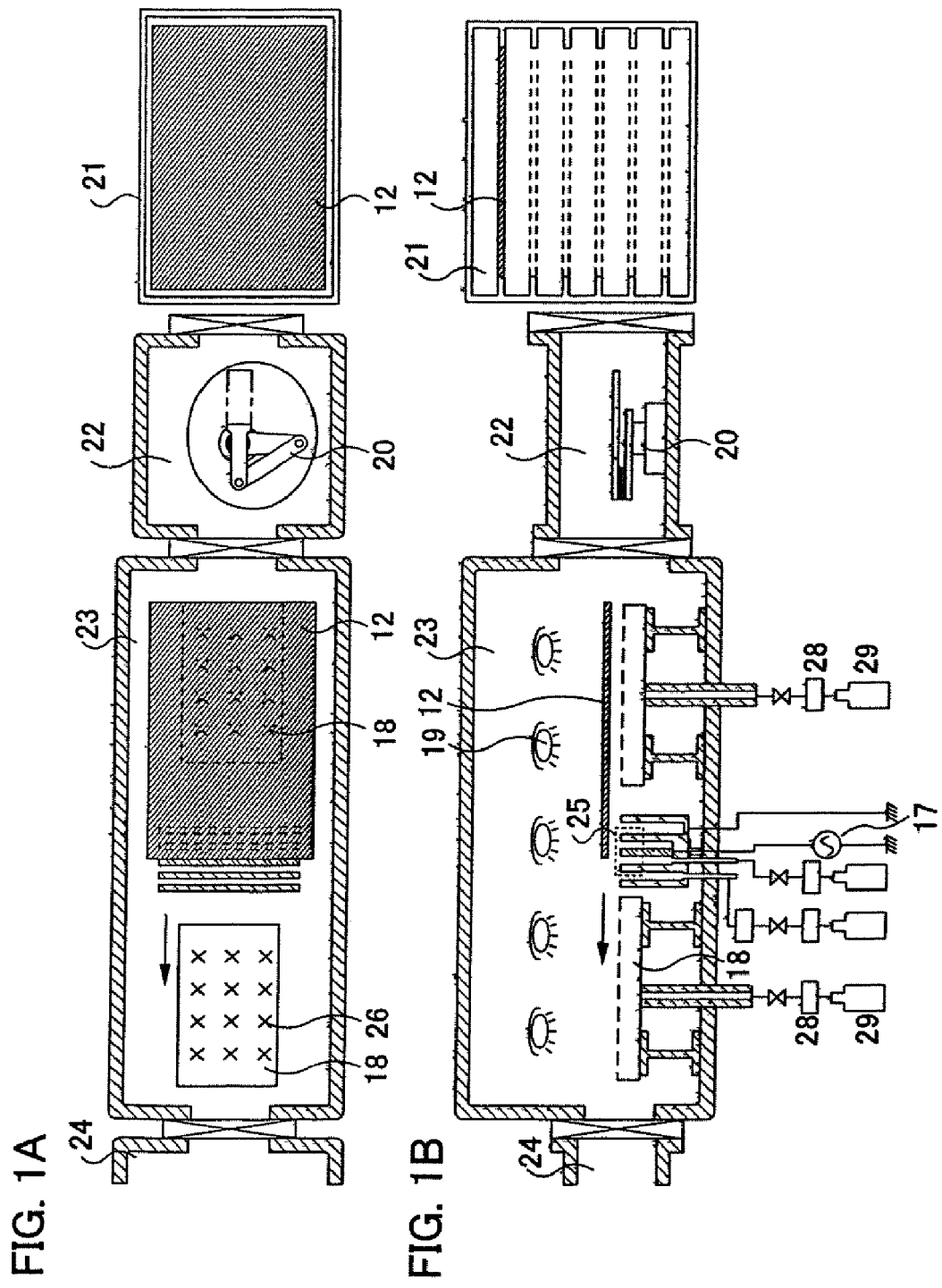
FIG. 1A is a top view illustrating a plasma treatment apparatus of the present invention and FIG. 1B is a cross-sectional view illustrating a plasma treatment apparatus of the present invention.

In the present embodiment mode, a plasma treatment apparatus of the present invention is described using from FIG. 1A to FIG. 3 and FIG. 6. FIG. 1A is a top view of the plasma apparatus of the present invention and FIG. 1B is a cross-sectional view. In the FIG. 1A and 1B, an object to be treated 12 such as a glass substrate that a surface treatment is carried out, a resin substrate, a semiconductor substrate is set in a cassette chamber 21. As the object to be treated 12, a substrate of a desired size is used regardless of a large-sized substrate (for example, 300 mm×360 mm) and a usual substrate (for example, 127 mm×127 mm). Note that, it is preferable that a pretreatment such as cleaning be carried out beforehand for the substrate set in the cassette chamber 21.

Reference numeral 22 denotes a transport chamber, and the object to be treated 12 placed in the cassette chamber 21 is transported to a plasma treatment chamber 23 through a transport mechanism 20, for example, a robot arm. In the plasma treatment chamber 23 adjoining the transport chamber 22, a flow of an atmosphere is made in order to cut off the air for the dust proof, and an airflow control means 18 for also transporting the object to be treated 12, a heating means 19, and a plasma generation means 25 are provided. A known heating means such as a halogen lamp may be used for the heating means 19, which is heated from the reverse side of the object to be treated 12. The airflow control means 18 and an exit cone of gas 26 control airflow using a transporting gas such as an inert gas provided from a gas supply means 29. In the present invention, the plasma treatment apparatus is operated under an atmospheric pressure or around atmospheric pressure; therefore, pollution from the external and flow back of reaction product can be prevented by solely controlling airflow near the plasma generation means 25 by the airflow control means 18. Accordingly, it is also possible to separate externally solely by the airflow control means 18, and there is no need to seal the plasma treatment chamber 23 completely. In addition, in the present invention, the times for a vacuuming and an atmospheric opening are unnecessary for pressure reducing equipment, and there is no need to place a complicated vacuum system.

Moreover, a gas provided from the gas supply means 29 is heated to a desired temperature (for example, from 50° C. to 800° C.) by a heating means 28, and the object to be treated 12 is heated by blowing this heated gas to the object to be treated 12. The heating means 28 is not limited in particular, as long as it can heat a gas, and a known means may be used. In the present invention, the object to be treated 12 is heated by blowing a heated gas over, and furthermore, the reverse side of the object to be treated 12 is heated by the heating means 19. As mentioned, the object to be-treated 12 is heated uniformly by heating both side of the object to be treated 12. Moreover, an inert gas may be used for a transporting gas that is provided from the gas supply means 29.

Figure 2:
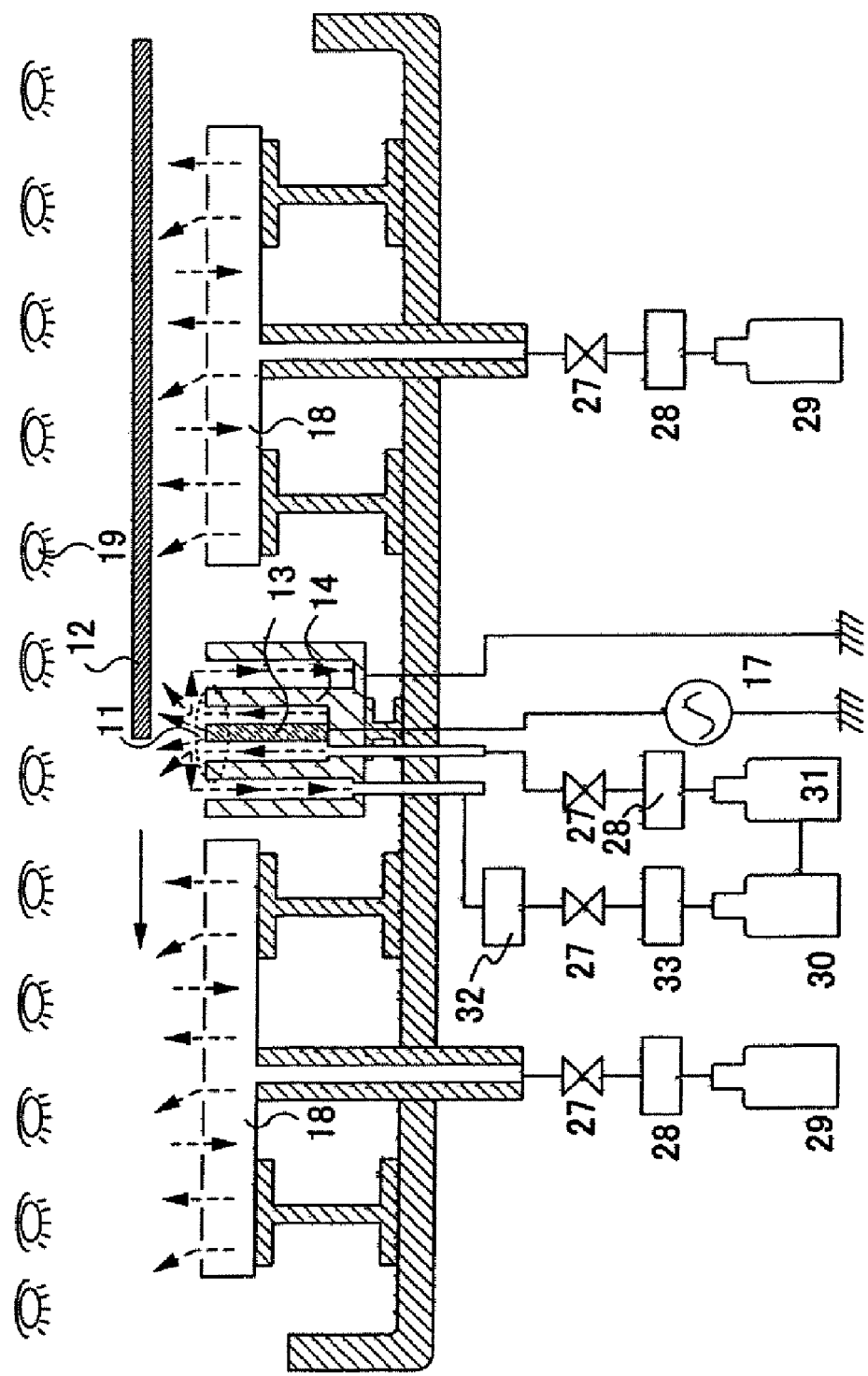
FIG. 2 is a schematic diagram showing a plasma treatment apparatus of the present invention.

The plasma generation means 25 is composed of a first electrode 13 and a second electrode 14, and connected to a high frequency power source 17, an exhausting system, a gas supply means, and the like (FIG. 2). In the plasma treatment chamber 23, the object to be treated 12 that has finished a surface treatment of predetermined is transported to a transport chamber 24, and it is transported to another treatment chamber from the transport chamber 24.

Note that, either or both of the first electrode 13 and the second electrode 14 may he covered with a solid dielectric. As a solid dielectric, metallic oxide such as aluminum oxide, zirconium oxide, and titanium dioxide; organic material such as polyethyleneterephthalate and polytetrafluoroethylene; and oxide such as glass, silicon oxide, barium titanate can be given. The shape of a solid dielectric may also be in a sheet or a film; however, it is preferable to have a thickness of from 0.05 mm to 4 mm. This is because a high voltage is necessary to make discharge plasma; therefore, when a solid dielectric is too thin, dielectric breakdown will occur during applying a voltage, and arc discharge is generated.

Next, a structure of the detailed plasma generation means 25 is described using a cross-sectional view of FIG. 2. A dotted line in FIG. 2 denotes a pathway of a gas. Reference numerals 13 and 14 denote electrodes formed of metal having conductivity such as aluminum, stainless steel, and the first electrode 13 is connected to a power source (high frequency power source) 17. Note that, a cooling system (not shown in a figure) for circulating cooling water may be connected in the first electrode 13. A heat in the case that a surface treatment is carried out continuously can be prevented by circulating the cooling water by providing the cooling system, and an efficiency can be improved by a continuous treatment. The second electrode 14 is formed in a shape of surrounding the periphery of the first electrode 13, and is grounded electrically. In addition, the first electrode 13 and the second electrode 14 are formed in a cylindrical shape having a gas supply port of a nozzle shape at its edge. A heated gas heated by the heating means 28 is provided in the space between the both electrodes of the first electrode 13 and the second electrode 14. Accordingly, the atmosphere of the space is substituted, and in this condition, by the high frequency power source 17, a high frequency voltage (for example, from 10 MHz to 500 MHz) is applied to the first electrode 13, which generates plasma 11 within the space. A reactive gas flow including a chemically active excited species such as ions and radicals generated by the plasma 11 is irradiated towards the object to be treated 12; therefore, a surface treatment such as thin film formation and cleaning over the surface of the object to be treated 12 is carried out.

Furthermore, in the FIG. 2, reference numeral 27 denotes a valve, reference numeral 28 denotes a heating means, reference numerals from 29 to 31 denote gas supply means, reference numeral 32 denotes an exhaust gas, and reference numeral 33 denotes a filter. In the heating means 28, gas supplied by the gas supply means from 29 to 31 is heated up to a desired temperature (for example, from 50° C. to 800° C.). Note that, the reference numeral 29 is the gas supply means for a transporting gas, the reference numeral 30 is the gas supply means for purified gas, and the reference numeral 31 is the gas supply means for a processing gas. As the transporting gas, a gas is used that does not give an effect to a surface treatment carried out within a treatment chamber, such as an inert gas. Furthermore, a processing gas is set appropriately, according to the kind of a surface treatment carried out within a treatment chamber. The exhaust gas 32 is introduced into the filter 33 through the valve 27. In the filter 33, the dust that got mixed in the exhaust gas is removed. In addition, a gas purified by the filter 33 is introduced again to the gas supply means for the purified gas 30, and used again as a processing gas.

Moreover, as mentioned above, by the gas blown in an oblique direction and a vertical direction from the airflow control means 18 and the as from the space between the both electrodes, the object to be treated 12 is horizontally floated, and noncontact transported in the direction of movement. Near the electrodes, the gas is blown upwards, and the object to be treated 12 is floated by this gas. In addition, near the airflow control means 18, the gas is blown and sucked simultaneously, and the height that the object to be treated 12 is floated is controlled. Furthermore, using the valve 27, level accuracy of the object to be treated 12 is adjusted by the gas flow, and the distance between the object to be treated 12, and the first and second electrodes 13 and 14 is adjusted accurately. From the present structure, also against the large and thin object to be treated 12 that is difficult to transport, it can be prevented from being warped, and cracked in the worst case.

In addition, different from FIGS. 1A, 1B and FIG. 2 of the above, by placing a plurality of plasma generation means in the direction of movement, a plurality of surface treatments may be carried out continuously to the object to be treated 12. For instance, as shown in FIG. 3, a plurality of plasma generation means from 25A to 25C are placed in order, and a plurality of plasma generation means are carried out continuously by transporting the object to be treated 12 in the direction of movement. This is due to that the plasma treatment apparatus of the present invention is operated under an atmospheric pressure or around atmospheric pressure; therefore, there is no need to provide separately a treatment chamber that carry out each of the surface treatment. This is due to that the pollution from the external can be prevented only by providing the airflow control means 18. Furthermore, in the present invention, the airflow control means 18 for controlling the gas is used as a transport means of the object to be treated 12 by fixing the plasma generation means 25. Accordingly, in the case that a plurality of surface treatments are carried out continuously, in the same treatment chamber, the plasma generation means may be placed in the direction of movement in order, and the object to be treated 12 may be transported by using the airflow control means 18.

Figure 6C:
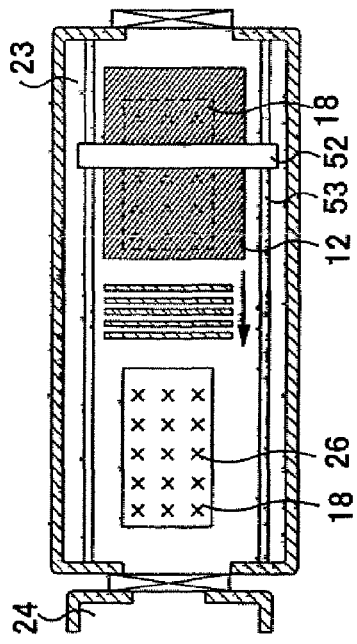
FIGS. 6A and C are top views illustrating a plasma treatment apparatus of the present invention and FIG. 6B is a cross-sectional view illustrating a plasma treatment apparatus of the present invention.
Figure 6A:
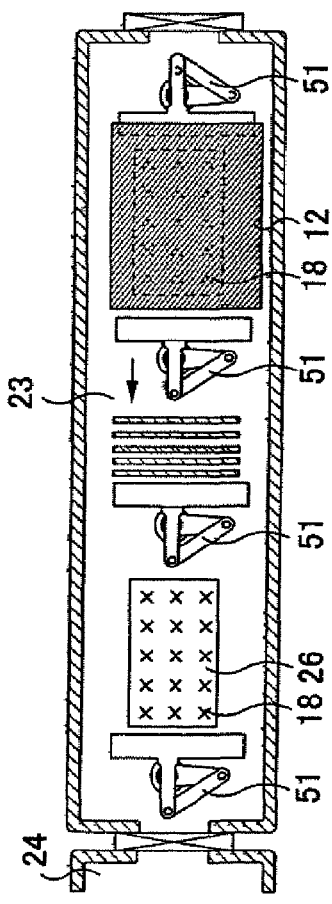
Figure 6B:
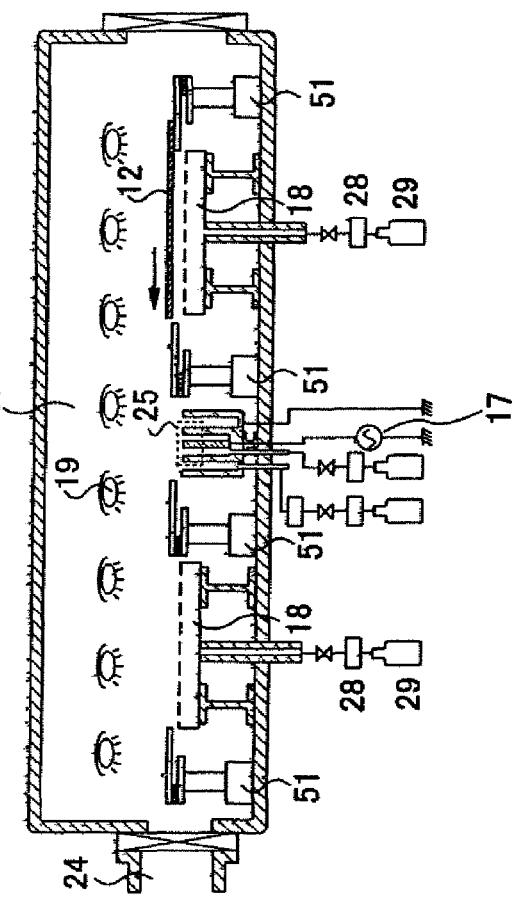

Note that, in FIG. 1A to FIG. 3 of the above, the object to be treated 12 is being transported by using the airflow control means 18. However, as shown in FIG. 6A and FIG. 6B, the object to be treated 12 may be transported by using airflow control means 18 and a transport mechanism 51 of mechanical. Therefore, the object to be treated 12 can be horizontally transported in the direction of movement. Furthermore, not the transport mechanism 51, but a rail 53 is provided in the direction of the object to be treated 12 as shown in FIG. 6C, and the object to be treated 12 may be transported horizontally using a fixed apparatus of the object to be treated 12 provided to a vehicle 52 that runs on the rail 53.

It is an object of the present invention to heat uniformly the object to be treated by blowing the heated gas, and in addition to floating the object to be treated horizontally and noncontact, transferring by the gas, the plasma treatment apparatus and the method for plasma treatment are provided that carry out the plasma treatment efficiently. Moreover, by the airflow control means for spraying the gas in an oblique direction and a vertical direction, the entire surface of the object to be treated (especially, suitable for a substrate of large size) is transformed, and the object to be treated is blown and sucked simultaneously in the airflow control means. Accordingly, the floated height of the object to be treated is adjusted, and the level accuracy of the object to be treated is adjusted with the gas flow to adjust the height of the object to be treated accurately. In the present invention having the above structure, the control of the distance between the plasma and the object to be treated can be carried out easily. Furthermore, in the present invention, the size of the object to be treated is not limited, and a plasma treatment can be carried out easily by transporting depending on the shape of the surface of the object to be treated.

In addition, in the present invention having the above structure, a deposition rate of the film, a rate of an etching treatment, and a rate of an ashing treatment are improved. Furthermore, a surface treatment of a plurality times tan be carried out continuously by placing the plasma generation means in order in the treatment chamber; therefore, a manufacturing apparatus is simplified.

Embodiment 1

In the present embodiment, the method for the plasma treatment apparatus of the present invention is described. In the case that a thin film is formed using a chemical vapor deposition over the surface of an object to be treated, in the case that an etching treatment, an ashing treatment, and a cleaning treatment are carried out is described below.

In the case of a thin film formation using a chemical vapor deposition (CVD) over the object to be treated 12 or the surface of the object to be treated 12 using the method for plasma treatment of the present invention, it is carried out by supplying a mixed gas of a source gas such as $Si_xH_y$, $SiH_xCl_y$; one of hydrogen, oxygen, nitrogen; and a rare gas to the plasma generation means 25 to generate the plasma from the gas supply means for processing gas 31 in FIG. 1A to FIG. 3 and FIG. 6. For instance, silicon is formed using a mixed gas of $SiCl_4$ (silicon tetrachloride gas), a hydrogen gas, and a rare gas.

In the case of carrying out an etching treatment over the object to be treated 12 or the surface of the object to be treated 12, it is carried out by supplying a mixed gas containing a source gas such as $NF_3$, fluorocarbon ($CF_4$), $SF_6$, $CO_x$; one of hydrogen and oxygen; and a rare gas to the plasma generation means 25 to generate the plasma from the gas supply means 31. For instance, an etching treatment is carried out by generating a fluorine atom using a source gas such as $NF_3$ and $SF_6$, which is vaporized as a $SiF_4$ as by reacting with solid silicon to exhaust to the external.

In the case of carrying out an ashing treatment over the object to be treated 12 or the surface of the object to be treated 12, it is carried out by supplying a source gas of oxygen, and one of hydrogen, fluorocarbon ($CF_4$), $NF_3$, $H_2O$, and $CHF_3$ to the plasma generation means 25 to generate the plasma from the gas supply means 31. For instance, an ashing treatment of a photosensitive organic resist is carried out by introducing oxygen and fluorocarbon to generate $CO_2$, $CO$, and $H_2O$, and by peeling the resist.

Moreover, a cleaning treatment of the components composing the plasma treatment apparatus of the present invention may be also carried out, and especially, a cleaning treatment of the electrodes 13 and 14 may be carried out. In that case, the cleaning is carried out by the plasma used a gas such as $NF_3$, fluorocarbon, $SF_6$, and $CO_x$, and especially, $O_2$ in the case of the organic material.

The present embodiment can be freely combined with the embodiment mode.

Embodiment 2

In the present embodiment, a surface treatment of the object to be treated (substrate) is carried out continuously by using the plasma treatment apparatus of the present invention, and the case of manufacturing a thin film transistor (so called bottom gate type) is described. Herein, a manufacturing process of an n-channel type TFT and a p-channel type TFT over one substrate is described using FIGS. 4A to 4G and FIGS. 5A to 5E.

Figure 4A:
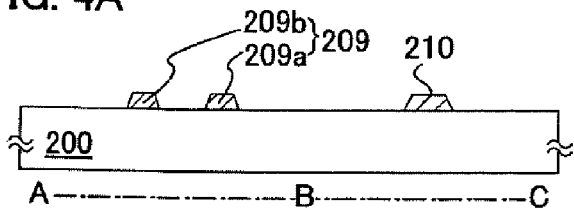
FIGS. 4A to 4G are schematic diagrams showing a process flow of manufacturing a thin film transistor.

As a substrate 200, a substrate having an insulating surface such as a glass substrate is used (FIG. 4A). Over the substrate 200, the predetermined patterning is carried out to the metal such as W—Si (tungsten silicon); silver (Ag); and TaN (tantalum nitride), and gate electrodes 209 and 210 are formed to have a thickness of from 50 nm to 500 nm. In the present embodiment, as the gate electrodes 209 and 210, W—Si (tungsten silicon) is formed to have a thickness of 200 nm by sputtering that used a target of W (tungsten). The top view of this is shown in FIG. 4F.

Figure 4B:
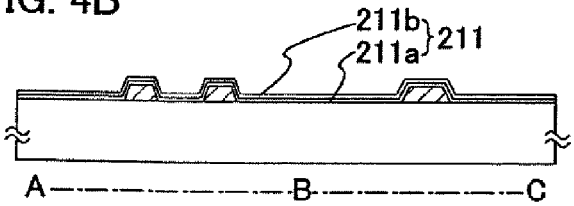

Next, a gate insulating film 211 is formed over the gate electrodes 209 and 210 (FIG. 4B). The gate insulating film 211 is formed of an insulating film containing silicon so that the film thickness is from 30 nm to 200 nm by plasma CVD using the plasma treatment apparatus of the present invention. In addition, the gate insulating film 211 is formed to have a two-layer structure. As the first layer, a silicon oxide film 211a is formed to have a thickness of from 10 nm to 200 nm (preferably, from 50 nm to 100 nm) using a mixed gas of TEOS (Tetraethyl Orthosilicate) and $O_2$. As the second layer, a silicon nitride film 211b is formed to have a thickness of from 50 nm to 200 nm (preferably, from 100 nm to 150 nm) using $SiH_4$ and $N_2$ as a reactive gas. In the present embodiment, the plasma generation means that forms the silicon oxide film 211a and the plasma generation means that forms the silicon nitride film 211b are placed in order in the direction of movement, and the silicon oxide film 211a of the first layer is formed to have a thickness of 50 nm and the silicon nitride film of the second layer is formed to have a thickness of 100 nm continuously by changing appropriately the gas provided from the gas supply means in each of the plasma generation means. Note that, each of the plasma generation means is separated from the airflow control means, and the object to be treated 12 is transported while noncontact floating by the airflow control means.

Note that, the gate insulating film 211 is not limited to the two-layer structure, and it may be in more than a three-layer structure, or may be structured using material besides silicon oxide film and silicon nitride film. However, it is set so that the desired capacity as a TFT can be obtained, taking account of a dielectric constant of the thin film.

Figure 4C:
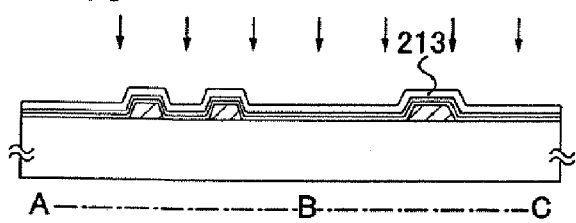

Next, an amorphous semiconductor film 213 is formed on the gate insulating film 211 (FIG. 4C). The amorphous silicon film 213 is formed to have a thickness of from 25 nm to 80 nm (preferably, from 30 nm to 60 nm) using $SiH_4$ gas by plasma CVD using the plasma treatment apparatus of the present invention. In the present embodiment, an amorphous silicon film is also formed continuously to have a film thickness of 50 nm by placing the plasma generation means for forming the amorphous semiconductor film 213 in order in the direction of movement, following the plasma generation means that formed the above gate insulating film 211.

Figure 4D:
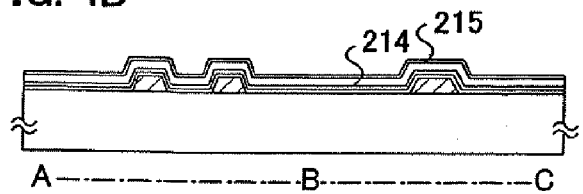

Thereafter, a crystalline semiconductor film 214 is formed by crystallizing the amorphous semiconductor film 213 by laser crystallization (FIG. 4D). Note that, a gas laser or a solid-state laser of continuous oscillation or pulse oscillation may be used in a laser for manufacturing a crystalline semiconductor film by the laser crystallization. As the former gas laser, an excimer laser and the like can be given, and as the latter solid-state laser, a laser used crystal such as YAG and $YVO_4$ that Cr, Nd, and the like are doped is given. Note that, a solid-state laser that can make continuous oscillation is used in crystallizing the amorphous semiconductor film, and it is preferable to apply from the second harmonic to the fourth harmonic of the fundamental in order to obtain crystals in a large diameter. In the case of using the above laser, it may be irradiated to the semiconductor film by concentrating a laser beam radiated from a laser oscillator into a linear shape with an optical system. A condition for crystallization is given appropriately; however, in the case that an excimer laser is used, a pulse oscillation frequency may be as 300 Hz and laser energy density may be set to from 100 $mJ/cm^2$ to 700 $mJ/cm^2$ (preferably, from 200 $mJ/cm^2$ to 300 $mJ/cm^2$).

In the present invention, the crystalline semiconductor film 214 is formed using YAG laser, a pulse oscillation frequency is set from 1 Hz to 300 Hz using its second harmonic, and a laser energy density is set from 300 $mJ/cm^2$ to 1000 $mJ/cm^2$ (preferably, from 350 $mJ/cm^2$ to 500 $mJ/cm^2$). In this case, laser light that is concentrated into a linear shape to have a width of from 100 µm to 1000 µm (preferably, a width of 400 µm) is irradiated over the entire surface of the substrate, and, in this case, it may be carried out under an overlap ratio of the linear beam of from 50% to 98%. Furthermore, in the present embodiment, a laser irradiation apparatus is placed according to the direction of movement of the substrate 200 in the same treatment chamber that formed the gate insulating film 211 and the amorphous semiconductor film 213 of the above. Moreover, up to the laser crystallization of the amorphous semiconductor film 213 has been carried out continuously following the formation of the amorphous semiconductor film 213 in the same treatment chamber.

Subsequently, an insulating film 215 is formed on the crystalline semiconductor film 214. In the present embodiment, the silicon oxide film 211a is formed to have a thickness of 50 nm by plasma CVD using a mixed gas of TEOS and $O_2$. In addition, a plasma generation means for forming a silicon oxide film is placed after placing the laser irradiation apparatus that carried out the above laser crystallization in the same treatment chamber. As a result, it is possible to carry out continuously a total of five times of a surface treatment, that is, the gate insulating film (two-layer) 211 is formed; the amorphous semiconductor film 213 is formed; the laser crystallization is carried out; and the insulating film 215 is formed in the same treatment chamber. As mentioned, in the present invention, it is possible to carry out a plurality of surface treatments continuously in the same treatment chamber by fixing the plasma generation means and by placing it in order in the direction of transporting the object to be treated. Consequently, it results in the prevention of pollution and the decrease of the time required, and the productivity will be increased.

Figure 4E:
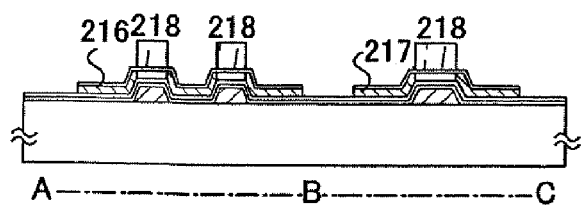
Figure 4F:
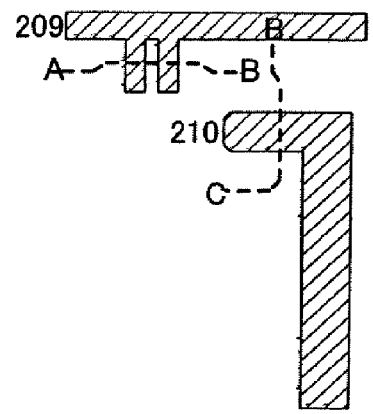
Figure 4G:
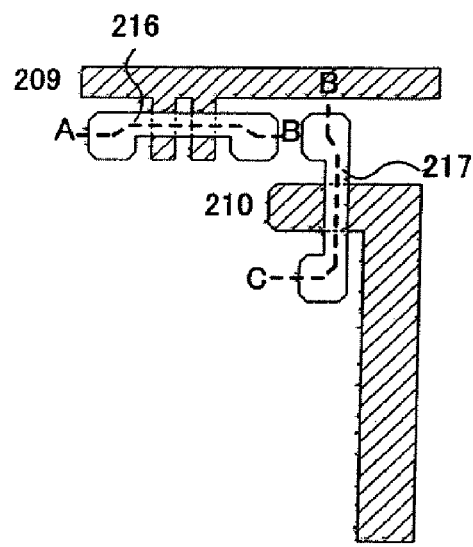

Next, semiconductor layers 216 and 217 are formed by patterning the crystalline semiconductor film 214 and the insulating film 215 into a desired shape (FIG. 4E and FIG. 4G). Subsequently, a mask 218 formed of resist is formed by carrying out back side exposure, using photolithography. Furthermore, a first doping treatment is carried out and an impurity element imparting n-type is doped with a low concentration to the semiconductor layers 216 and 217. The first doping treatment may be carried out by ion doping or ion implantation. The ion doping is carried out under the condition that dose amount is from $1\times10^{13}$ to $5\times10^{14}/cm^2$, and that an acceleration voltage is from 40 keV to 80 keV. Moreover, as for the impurity element imparting n-type, an element belonging to the Group 15 may be used, and typically, phosphorus (P) and arsenic (As) are used. In the present embodiment mode, an impurity region is formed in a self-aligning manner under the condition that dose amount is $5.0\times10^{13}/cm^2$ and an acceleration voltage is 50 keV with a method for ion doping, and using P (phosphorus) as an impurity element imparting n-type. In this case, an impurity element imparting n-type within the concentration of from $1\times10^{18}$ to $1\times10^{20}/cm^3$ is doped in the impurity region.

Figure 5A:
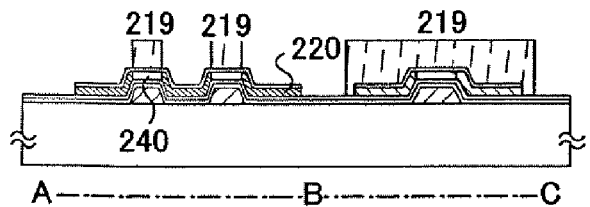
FIGS. 5A to 5E are schematic diagrams showing a process flow of manufacturing a thin film transistor.

After removing the mask 218 formed of the resist, a second doping treatment is carried out in a higher acceleration voltage than the first doping treatment by forming a new mask 219 formed of resist (FIG. 5A). The second ion doping is carried out under the condition that dose amount is from $1\times10^{13}$ to $3\times10^{15}/cm^2$, and that an acceleration voltage is from 60 keV to 120 keV. In the present embodiment mode, as a result of carrying out the doping treatment under a condition that dose amount is $3.0\times10^{15}/cm^2$ and an acceleration voltage is 65 keV, an impurity element imparting n-type within the concentration of from $1\times10^{19}$ to $5\times10^{21}/cm^3$ is doped in an impurity region 220. In addition, a region 240 is formed that is a region that an impurity element is not doped at all or a region that a small amount of an impurity element is doped (collectively, referred to as a channel formation region).

Figure 5B:
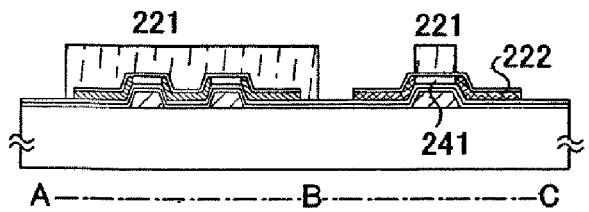

Next, after removing the mask 219 formed of the resist, a new mask 221 formed of resist is formed (FIG. 5B). Subsequently, a third doping treatment is carried out, and, an impurity region is formed that an impurity element imparting a conductive type contrary to the first conductive type is doped in a semiconductor layer that become an active layer of a p-channel type TFT. In the present embodiment, an impurity region 222 is formed in a self-aligning manner by using the mask 221 formed of the resist as a mask for an impurity element and by doping an impurity element imparting p-type. Furthermore, an impurity region is formed by ion doping used diborane ($B_2H_6$) under a condition that dose amount is $1\times10^{16}/cm^2$ and an acceleration voltage is 80 keV. By the present doping treatment, the doping treatment is carried out so that the concentration of the impurity element imparting p-type is from $1\times10^{19}$ to $5\times10^{21}$ atoms/$cm^3$. In addition, a channel formation region 241 is formed.

Note that, a desired impurity region may be formed by changing appropriately a condition for carrying out a doping treatment, and by carrying out a doping treatment for a plurality times of more than twice.

Figure 5C:
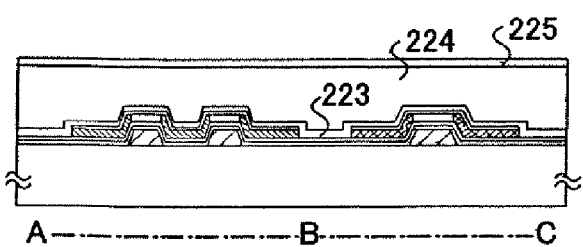

Moreover, a first interlayer insulating film 223 formed of an insulating film is formed (FIG. 5C). As the first interlayer insulating film 223, an insulating film containing silicon is formed to have a thickness of from 100 nm to 200 nm by plasma CVD. In the present embodiment, a silicon oxynitride film 223 is formed to have a film thickness of 100 nm by plasma CVD. Next, a second interlayer insulating film 224 is formed on the first interlayer insulating film 223. As the second interlayer insulating film 224, a silicon oxide film formed by CVD; an silicon oxide film coated by SOG (Spin On Glass) or by a spin coat method; an organic insulating film such as acryl or an organic insulating film of non-photosensitivity, each of which is coated by SOG (Spin On Glass) or by a spin coat method, is formed to have a thickness of from 0.7 μm to 5 μm preferably, from 2 μm to 4 μm). In the present embodiment, an acryl film having a film thickness of 1.6 μm is formed by CVD. Note that, the second interlayer insulating film 224 serves as a planarizing layer by reducing the unevenness made by TFT formed over the substrate 200; therefore, a film distinguished in planarity is preferably used as the second interlayer insulating film 224.

Next, a third interlayer insulating film 225 is formed on the second interlayer insulating film. In the third interlayer insulating film 225, a silicon nitride film or a silicon nitride oxide film is formed to have a thickness of from 0.1 μm to 0.2 μm by a CVD method. In the present embodiment, a silicon nitride film 225 is formed to have a thickness of 0.1 μm by a CVD method. By forming from the first interlayer insulating film 223 to the third interlayer insulating film 225, a blocking effect can be obtained that prevent the penetration of impurities of ionic of each kind as well as moisture within oxygen and atmosphere.

Figure 5D:
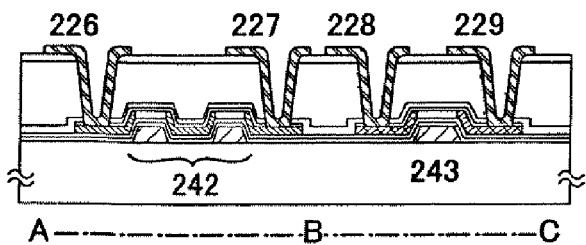

In addition, contact holes are formed using dry etching or wet etching (FIG. 5D). In the present embodiment mode, the first interlayer insulating film 223 to the third interlayer insulating film 225 are etched, and the contact holes reaching to the impurity regions 210 and 222 are formed. Subsequently, wirings from 226 to 229 that are electrically connected to each of the impurity regions are formed. In the present embodiment mode, Ti film having a film thickness of 100 nm; Al film having a film thickness of 350 nm; and Ti film having a film thickness of 100 nm are continuously formed to be laminated by the wirings from 226 to 229, which are formed by patterning and etching into a desired shape. Note that, it is not limited to the three-layer structure, and it may be formed with a layer structure of below two-layer structure and more than four-layer structure. Furthermore, material of wirings is not limited to Al and Ti, and other conductive films may be used.

Figure 5E:
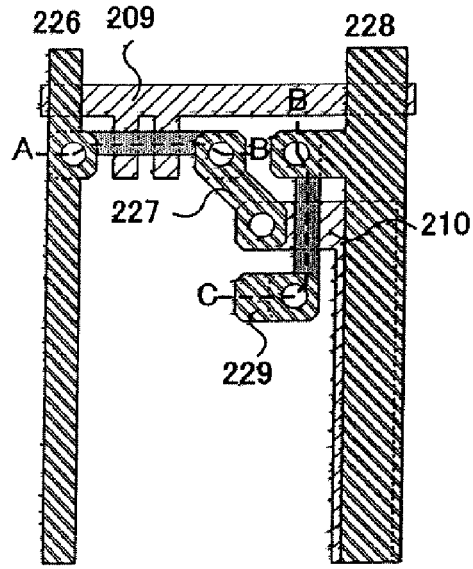

From the above-mentioned process, a pixel portion having an n-channel type TFT 242 and a p-channel type TFT 243 can be formed over one substrate. The top view of it is shown in FIG. 5E.

The n-channel type TFT 242 has the channel formation region 240 overlapped with the gate electrode 209 and the impurity region 220 that functions as a source region or a drain region. In addition, the p-channel type TFT 243 has the channel formation region 241 overlapped with the gate electrode 210 and the impurity region 222 that functions as a source region or a drain region.

In the present embodiment, a surface treatment of the object to be treated can be carried out continuously for a plurality of times in one treatment chamber. Therefore, the time required in the manufacturing process is decreased and the productivity is increased. In addition, the manufacturing process is simplified compared with the case carrying out each of the surface treatments in different treatment chambers; therefore, the yield rate of the manufacturing is improved and the manufacturing cost is decreased.

In the present embodiment, crystalline semiconductor films are used for forming TFTs, however the present invention is not limited thereto. The present invention can be applied to manufacturing TFTs using amorphous semiconductors.

What is claimed is:

1. A method for manufacturing a semiconductor device comprising:
   forming a gate electrode over a substrate;
   forming a gate insulating film over the gate electrode by plasma treatment; and
   forming a semiconductor film over the gate insulating film by plasma treatment,
   wherein the plasma treatments are performed under an atmospheric pressure or around atmospheric pressure, and
   wherein the steps of forming the gate insulating film and forming the semiconductor film are performed continuously in the same treatment chamber.

2. The method for manufacturing a semiconductor device according to claim 1, further comprising forming an insulating film over the crystalline semiconductor film by plasma treatment.

3. The method for manufacturing a semiconductor device according to claim 1, wherein plasma CVD is used for each of the plasma treatments.

4. The method for manufacturing a semiconductor device according to claim 1, wherein the substrate is one selected from a group consisting of a glass substrate, a resin substrate, and a semiconductor substrate.

5. A method for manufacturing a semiconductor device comprising:
   forming a gate electrode over a substrate;

forming a gate insulating film over the gate electrode by plasma treatment; and forming a semiconductor film over the gate insulating film by plasma treatment, wherein the plasma treatments are performed under an atmospheric pressure or around atmospheric pressure, and wherein the substrate is transferred with being floated by blowing a gas to the substrate.

6. The method for manufacturing a semiconductor device according to claim 5, further comprising forming an insulating film over the crystalline semiconductor film by plasma treatment.

7. The method for manufacturing a semiconductor device according to claim 5, wherein plasma CVD is used for each of the plasma treatments.

8. The method for manufacturing a semiconductor device according to claim 5, wherein the substrate is one selected from a group consisting of a glass substrate, a resin substrate, and a semiconductor substrate.

9. The method for manufacturing a semiconductor device according to claim 5, wherein the gas is an inert gas.

10. A method for manufacturing a semiconductor device comprising:

forming a gate electrode over a substrate;

forming a gate insulating film over the gate electrode by plasma treatment;

forming an amorphous semiconductor film over the gate insulating film by plasma treatment; and crystallizing the amorphous semiconductor film by laser irradiation, wherein the plasma treatments are performed under an atmospheric pressure or around atmospheric pressure, and wherein the steps of forming the gate insulating film, forming the amorphous semiconductor film and crystallizing the amorphous semiconductor film are performed continuously in the same treatment chamber.

11. The method for manufacturing a semiconductor device according to claim 10, further comprising forming an insulating film over the crystalline semiconductor film by plasma treatment.

12. The method for manufacturing a semiconductor device according to claim 10, wherein plasma CVD is used for each of the plasma treatments.

13. The method for manufacturing a semiconductor device according to claim 10, wherein the substrate is one selected from a group consisting of a glass substrate, a resin substrate, and a semiconductor substrate.

14. A method for manufacturing a semiconductor device comprising:

forming a gate electrode over a substrate;

forming a gate insulating film over the gate electrode by plasma treatment;

forming an amorphous semiconductor film over the gate insulating film by plasma treatment; and crystallizing the amorphous semiconductor film by laser irradiation, wherein the plasma treatments are performed under an atmospheric pressure or around atmospheric pressure, and wherein the substrate is transferred with being floated by blowing a gas to the substrate.

15. The method for manufacturing a semiconductor device according to claim 14, further comprising forming an insulating film over the crystalline semiconductor film by plasma treatment.

16. The method for manufacturing a semiconductor device according to claim 14, wherein plasma CVD is used for each of the plasma treatments.

17. The method for manufacturing a semiconductor device according to claim 14, wherein the substrate is one selected from a group consisting of a glass substrate, a resin substrate, and a semiconductor substrate.

18. The method for manufacturing a semiconductor device according to claim 14, wherein the gas is an inert gas.

* * * * *